United States Patent
Cleveland et al.

(10) Patent No.: US 6,507,527 B1
(45) Date of Patent: Jan. 14, 2003

(54) MEMORY LINE DISCHARGE BEFORE SENSING

(75) Inventors: Lee Cleveland, Santa Clara, CA (US); Jin-Lien Lin, Sunnyvale, CA (US); Takao Akaogi, Cupertino, CA (US); Ali Al-Shamma, San Jose, CA (US); Boon Tang Teh, Penang (MY); Kendra Nguyen, San Jose, CA (US); Yong Kim, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/698,614

(22) Filed: Oct. 27, 2000

Related U.S. Application Data

(60) Provisional application No. 60/223,498, filed on Aug. 7, 2000.

(51) Int. Cl.$^7$ .................................................. G11C 7/00
(52) U.S. Cl. .......................... 365/204; 365/154; 365/203
(58) Field of Search ................................. 365/204, 154, 365/203, 129, 189.01

(56) References Cited

U.S. PATENT DOCUMENTS

| | | | | |
|---|---|---|---|---|
| 5,946,251 A | * | 8/1999 | Sato et al. | 365/203 |
| 5,986,474 A | * | 11/1999 | Chung et al. | 326/86 |
| 5,986,923 A | * | 11/1999 | Zhang et al. | 365/154 |
| 6,075,729 A | * | 6/2000 | Ohhata et al. | 365/190 |

\* cited by examiner

*Primary Examiner*—Hoai Ho

(57) ABSTRACT

A method of charging a data line to a desired voltage level prior to the data line being sensed in a low power memory device by discharging the data line from a voltage level above the desired voltage level to approximately the desired voltage level. By using N-type transistors to discharge the data line to the desired voltage level, the voltage level can be reached faster with cheaper components.

19 Claims, 3 Drawing Sheets

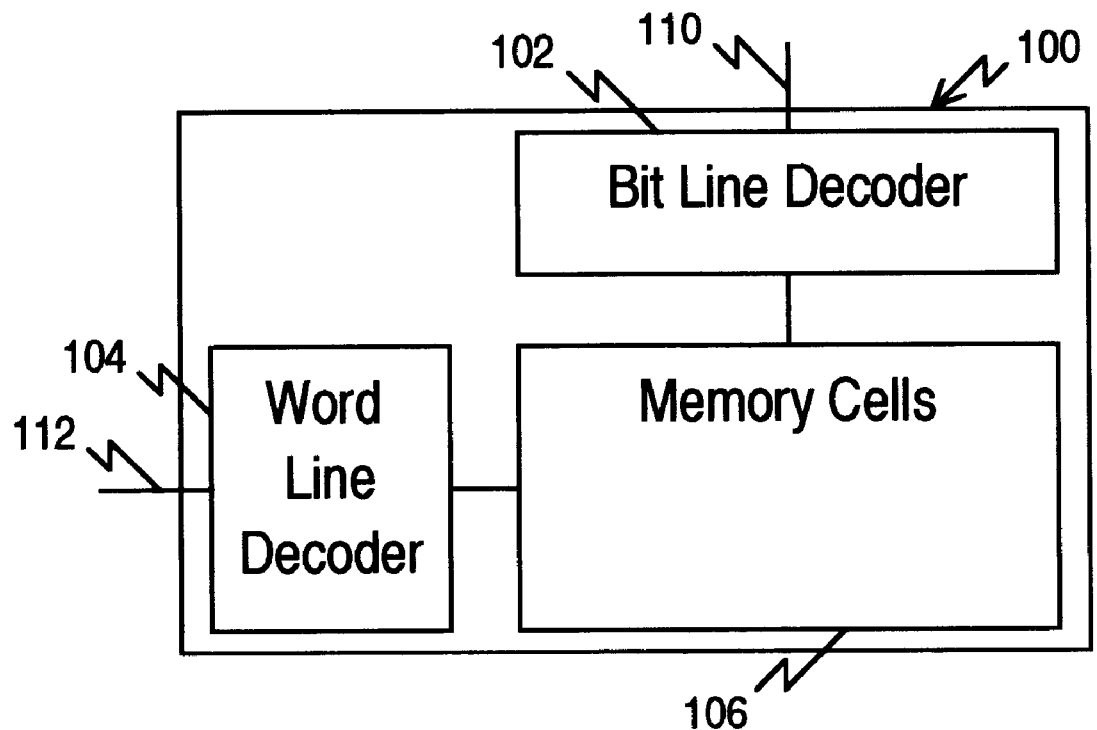
Figure 1
(conventional)

MEMORY LINE DISCHARGE BEFORE SENSING

RELATED APPLICATION

This application claims the benefit of U.S. Provisional Application Serial No. 60/223,498 filed Aug. 7, 2000. The above application is incorporated herein by reference in its entirety.

BACKGROUND

The present invention relates to a method of charging high speed lines.

As illustrated in FIG. 1, a memory device 100 commonly includes a memory cells 106, a bit line decoder 102, which are also called column decoder 102, and a word line decoder 104, which is also called a row decoder.

Memory cells 106 is commonly configure such that a series of memory cells form rows and columns, Each memory cell is a transistor that has a source, gate, and drain. The gates of the memory cells in the same row are connected to a common word line. The word lines are connected to a word line decoder 104. The sources of the memory cells in a column are connected to a common source-column line that is connected with a bit line decoder 102. The drains of the memory cells in the same column are connected to a common bitline, also called a drain-column line. The bit line 110 is connected to a bit line decoder 102. The terms "source" and "drain" can be used interchangeably because the source and drain of a transistor can be used interchangeably.

During a read operation, a memory cell is selected by the value placed on the address lines 110, 112. The word line decoder 104 places a voltage on the word line that corresponds to the memory cell(s) selected by the values placed on the address lines 112. The bit line decoder 102 places a voltage on the bitline that corresponds the memory cell(s) selected by the values placed on the address lines 110.

Some charging circuits charge the memory array's output data lines to ground. Others charge the data lines from ground to a predetermined level. These charging circuits use often P-type transistor circuit. P-type transistors are costly and have relatively low mobility. The low mobility causes the P-type transistor to charge the line slowly.

The output of the memory device 100 is sent to a sense amplifier. The sense amplifier detects the conductive (corresponding to a "one" or "on") or nonconductive (corresponding to a "zero" or "off") state of the memory cell that corresponds to the selected wordline and bitline.

BRIEF SUMMARY

A method of charging a data line to a desired voltage level prior to the data line being sensed in a low power memory device by discharging the data line from a voltage level above the desired voltage level to approximately the desired voltage level.

BRIEF DESCRIPTION OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

FIG. 1 is an illustration of a conventional memory device with an array of memory;

DETAILED DESCRIPTION

Memory devices, such as SRAM and DRAM, often need the data lines to be charged before the value on the line can be read. The desired voltage level can be reach faster and with less expensive components by presetting the line high then discharging the line to the desired voltage level. The discharging mechanism preferably uses an N-type transistor circuit, which is faster than a conventional P-type transistor circuit used to charge lines. This is especially important with low power, high speed memory devices.

Figure 2:
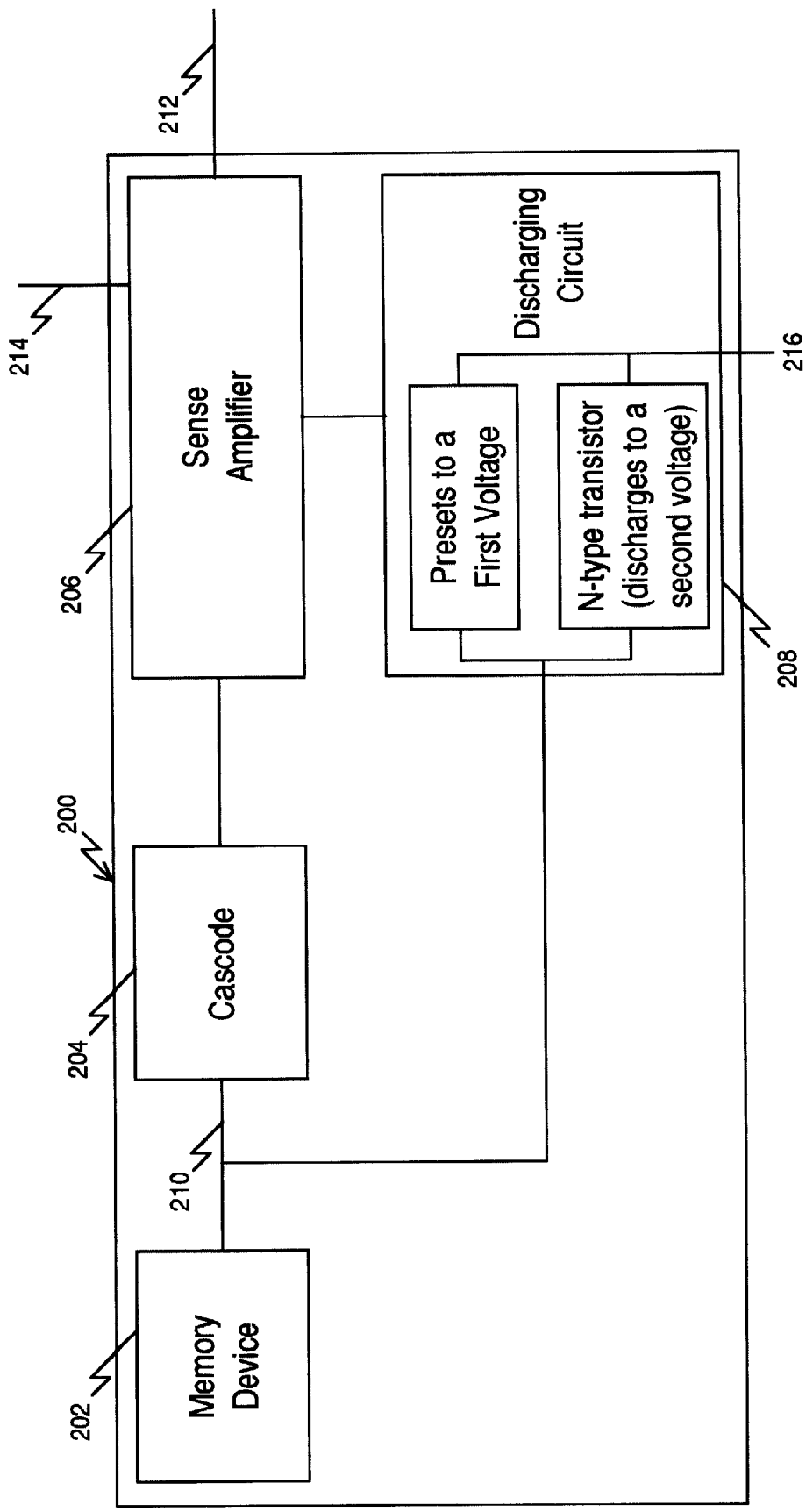
FIG. 2 is an embodiment of a memory system with a discharging circuit.

FIG. 2 illustrates an embodiment of a memory system 200 with a memory device 202, a sense amplifier 206, and a discharging circuit 208. The memory device 202 includes a plurality of memory cells. The memory cells can be any type of memory cell including: RAM, SRAM, DRAM, EEPROM, or other memory cells. The data lines 210 carry the data signals from the memory device 202 toward the sense amplifier 206. The sense amplifier 206 can include a Cascode circuit or a separate Cascode circuit 204 can be used. The signal lines 210 include data lines that carry the data signals from the memory device 202 toward the Cascode circuit 204 if one is present. A Cascode circuit 204 is a high gain, low noise, high input impedance amplifier circuit. The sense amplifier 206 conditions the data signals for external use on the external data lines 212. The sense amplifier 206 is controlled by a sense signal received on the control lines 214.

The discharging circuit 208 charges the data lines 210 before the data signal is sensed by the sense amplifier 206. Charging of the data lines 210 is desirable in many memory devices. The discharging circuit 208 is controlled by control lines 216. In an embodiment, the discharging circuit 208 presets the signal line to a first voltage level then discharges the signal line to a second, lower voltage level. In an embodiment, the control lines 216 select the value of the first and second voltage level. The discharging circuit 208 preferably uses N-type transistor to discharge the data lines 210 after they have been preset to reach the desired voltage level.

It is preferred that the data line being sensed be charged to a voltage near the supply voltage, e.g. Vcc. Once the data line has been preset, it is then discharged using an N-type transistor circuit to the desired voltage level. For example, a low voltage memory device may operate with a supply voltage of 1.6 volts and require the data lines to be charged to 0.5 volts before sensing. The data line can be coupled to the supply voltage then discharged to 0.5 volts using the N-type discharging circuit 208.

Figure 3:
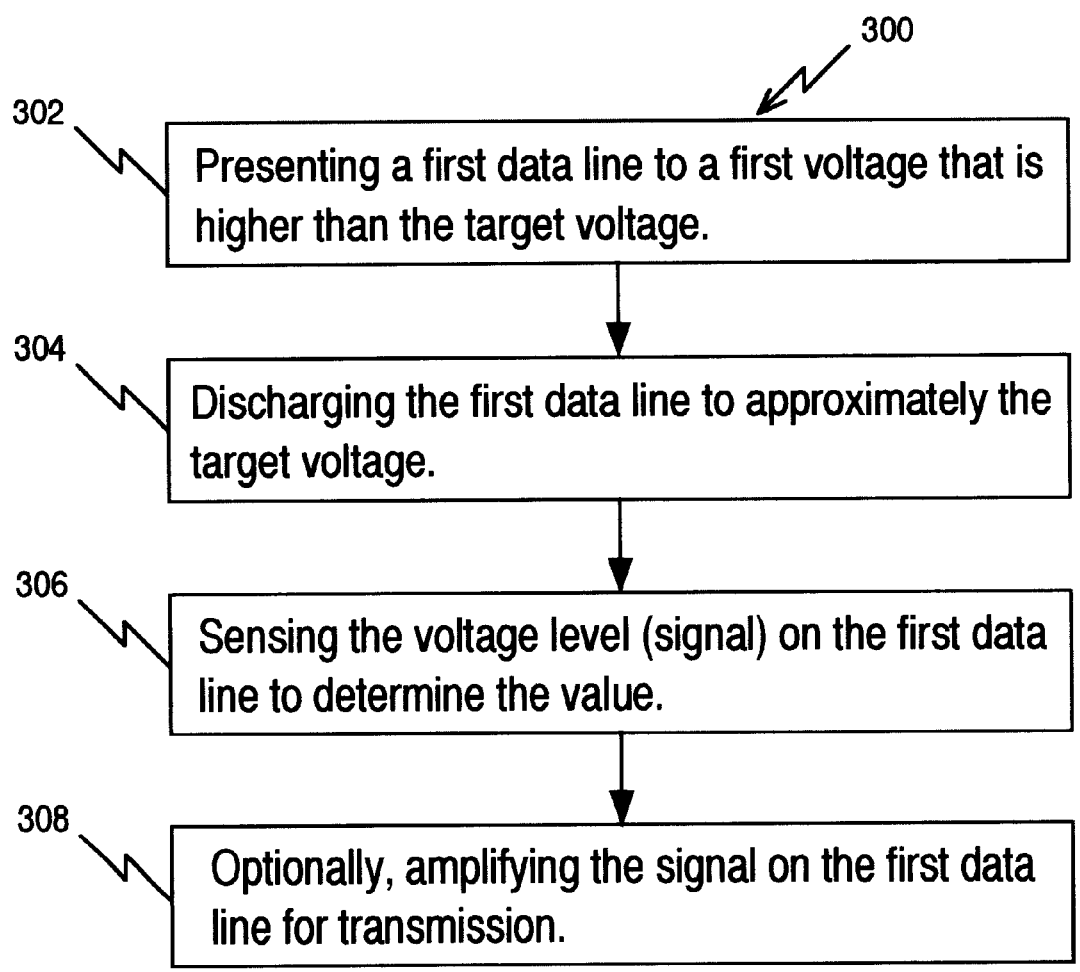
FIG. 3 is a flow diagram of a method of presetting a data line above the desired level, then discharging the data line to the desired level.

FIG. 3 is a flow diagram of a method 300 of presetting a data line above a desired voltage level then discharging the data line to the desired voltage level before sensing.

In 302, a first data line is preset or charged to a first voltage that is higher than the desired voltage. The first voltage can be any voltage, preferably less than or equal to the supply voltage. For example, the supply voltage can be 5.0 to 1.0 volts. Common supply voltages are 5.0 volts and 3.3 volts. Low voltage memory devices operate with voltage levels below 3.3 volts, for example 1.9 to 1.2 volts. In an embodiment, the first voltage can be substantially equal to the supply voltage. In an other embodiment, the first voltage is a fixed offset of the supply voltage, for example a memory system with a supply voltage of 1.8 volts has a first voltage of 1.4 volts and a second voltage of 0.6 volts.

In 304, the first data line is discharged to approximately the desired voltage level. In an embodiment, the preset voltage and/or the target voltages are dynamically selectable. The second voltage is preferably less than the first voltage. In an embodiment, the second voltage is 90 to 10 percent of the first voltage. In another embodiment, the second voltage is 50 to 20 percent of the first voltage. For example, the first voltage is 1.4 volts and the second voltage is 0.5 volts.

In 306, the voltage level on the first data line is sensed to determine a value of a memory cell.

In 308, the signal on the first data line is optionally amplified for external transmission. In an embodiment, a sense amplifier is used to amplify the signal.

In a first embodiment, the first data line is preset 302 to a first voltage level of 1.45 volts, which is substantially the supply voltage of 1.5 volts, then discharged 304 to the desired level of 0.75 volts. In an other embodiment, the first data line is preset 302 to a first voltage level of 1.0 volts, which is a predetermined offset from the supply voltage of 1.8 volts, then discharged 304 to the desired level of 0.50 volts While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A semiconductor device, comprising:
   (a) memory cells;
   (b) a sense amplifier connected with the memory cells via a set of signal lines having at least a first data line, the sense amplifier selectively sensing a value on the data line; and
   (c) a discharging circuit connected with the set of signal lines, the discharging circuit presetting the first data line to a first voltage level then discharging the first data line to a second voltage level before the sense amplifier sensing the value on the data line for a read operation, the first voltage level being greater than the second voltage level.

2. The circuit as recited in claim 1, wherein the first voltage is substantially equal to a supply voltage level.

3. The circuit as recited in claim 1, wherein the first voltage is less than a supply voltage level.

4. The circuit as recited in claim 1, wherein the memory cells are low voltage memory cells, and wherein a supply voltage is applied to the semiconductor device.

5. The circuit as recited in claim 4, wherein the supply voltage is less than 1.9 volts.

6. The circuit as recited in claim 1, wherein the discharging circuit comprises an N-type transistor discharging circuit.

7. The circuit as recited in claim 1, wherein the second voltage level is less than 40 percent of the first voltage level.

8. The circuit as recited in claim 1, wherein the first data line is a bit line.

9. The circuit as recited in claim 8, wherein the memory cells comprise SRAM memory cells.

10. A method of discharging on a data line to a desired voltage level in a low power memory device, comprising:
    presetting the data line to a higher voltage level; and
    discharging the data line from the higher voltage level to approximately the desired voltage level prior to sensing the data line for a read operation, wherein the higher voltage level is greater than the desired voltage level.

11. The method as recited in claim 10, wherein the discharging comprises presetting the data line to approximate a supply voltage.

12. The method as recited in claim 11, wherein the discharging comprises discharging the data line to less than 50 percent of the higher voltage.

13. The method as recited in claim 12, wherein the discharging comprises discharging the data line with an N-type transistor discharging circuit.

14. A semiconductor memory device, comprising:
    (a) a memory array comprising word lines, bit lines, and memory cells wherein the word lines and the bit lines intersect and the memory cells are located at the intersections of the word lines and the bit lines;
    (b) a first means for sense amplifying a signal from the memory array corresponding to a state of a memory cell;
    (c) a second means for selectively coupling a bit line to the first means; and
    (d) a third means for establishing a voltage level on the bit line coupled to the first means by presetting the bit line to a first voltage level then discharging the bit line to a second voltage level before the first means senses the signal on the bit line for a road operation, the first voltage level being greater than the second voltage level.

15. The device as recited in claim 14, wherein the first voltage level is within 10 percent of a supply voltage level.

16. The device as recited in claim 15, wherein the second voltage level is less than 60 percent of the first voltage.

17. The device as recited in claim 14, wherein the second means comprises a row decoder means and a column decoder means.

18. The device as recited in claim 14, wherein the third means comprises an N-type transistor discharging circuit.

19. The device as recited in claim 17, wherein the first and second voltage levels are selectable.

* * * * *

UNITED STATES PATENT AND TRADEMARK OFFICE
CERTIFICATE OF CORRECTION

PATENT NO.   : 6,507,527 B1
DATED         : January 14, 2003
INVENTOR(S)  : Lee Cleveland et al.

It is certified that error appears in the above-identified patent and that said Letters Patent is hereby corrected as shown below:

<u>Title page,</u>
Item [73], should read as follows:

-- [73]  Assignee:  Advanced Micro Devices, Inc., Sunnyvale, CA (US) and Fujitsu Limited, Kanagawa, (JP) --

Signed and Sealed this

Sixteenth Day of March, 2004

JON W. DUDAS
*Acting Director of the United States Patent and Trademark Office*